(12) United States Patent
Ku

(10) Patent No.: US 8,492,833 B2
(45) Date of Patent: Jul. 23, 2013

(54) SEMICONDUCTOR DEVICE HAVING A BURIED GATE

(75) Inventor: Soung Min Ku, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 35 days.

(21) Appl. No.: 13/176,896

(22) Filed: Jul. 6, 2011

(65) Prior Publication Data

US 2012/0007177 A1    Jan. 12, 2012

(30) Foreign Application Priority Data

Jul. 6, 2010    (KR) ........................ 10-2010-0064825

(51) Int. Cl.
*H01L 29/66*    (2006.01)
*H01L 27/108*    (2006.01)

(52) U.S. Cl.
USPC .......................................... 257/334; 257/296

(58) Field of Classification Search
USPC .................... 257/296, 334, 327, 401, E21.66, 257/E21.678, E21.683, E21.691; 438/128
See application file for complete search history.

(56) References Cited

U.S. PATENT DOCUMENTS

| | | | | |
|---|---|---|---|---|
| 6,091,154 A | * | 7/2000 | Ohkawa | 257/774 |
| 7,122,476 B2 | * | 10/2006 | Han | 438/701 |
| 2007/0080385 A1 | * | 4/2007 | Kim et al. | 257/296 |
| 2009/0173992 A1 | * | 7/2009 | Lee et al. | 257/327 |

FOREIGN PATENT DOCUMENTS

| | | |
|---|---|---|
| KR | 1020040060550 A | 7/2004 |
| KR | 1020050061221 A | 6/2005 |

* cited by examiner

*Primary Examiner* — N Drew Richards
*Assistant Examiner* — Christina Sylvia

(57) ABSTRACT

A semiconductor device includes a semiconductor substrate including a cell area and a peripheral circuit area, a first trench for device isolation formed in the cell area of the semiconductor substrate and a second trench for device isolation formed within the semiconductor substrate of the peripheral circuit area to be deeper than the first trench, a device isolation layer buried within the first and second trenches for device isolation and having the same surface level as the semiconductor substrate in the cell area, a buried gate buried in the semiconductor substrate of the cell area, and a peripheral circuit gate which is in contact with the semiconductor substrate of the peripheral circuit area, is buried within the device isolation layer of the peripheral circuit area, and has the same surface level as the buried gate. It can prevent the same effect from affecting the cell area and the peripheral circuit area so that the number of masks is reduced and the process is simplified so that cost can be reduced and characteristics of the semiconductor device can be improved.

10 Claims, 4 Drawing Sheets

SEMICONDUCTOR DEVICE HAVING A BURIED GATE

CROSS-REFERENCES TO RELATED APPLICATION

The present application claims priority to Korean patent application number 10-2010-0064825 filed on 6 Jul. 2010, which is incorporated by reference in its entirety.

BACKGROUND OF THE INVENTION

The embodiments of the present invention relates to a semiconductor device and a method of manufacturing the same.

A dynamic random access memory (DRAM) is one type of semiconductor device and includes a plurality of unit cells constituting of a capacitor and a transistor. The capacitor is used to store data and the transistor is used to transfer data between the capacitor and a bit line in response to a control signal (a word line) using a semiconductor property in which electrical conductivity is changed according to environmental conditions. The transistor includes a gate, a source and a drain. Charges move between the source and drain according to the control signal input to the gate. The charges move between the source and drain through a channel region using properties of the semiconductor.

When the conventional transistor is fabricated on a semiconductor substrate, the gate is formed on the semiconductor substrate and then the source and drain are formed by implanting impurities into the semiconductor substrate, thereby forming the channel region between the source and drain below the gate. The transistor having such a horizontal channel region occupies a large area in the semiconductor substrate. Since a complicated semiconductor memory device includes a plurality of transistors therein, it is difficult to reduce a total area thereof.

When the total area of the semiconductor memory device is reduced, the number of semiconductor memory devices per wafer is increased and productivity can be improved. Various methods of reducing the total area of the semiconductor memory device have been suggested. One of these methods uses a transistor having a recessed gate. In this method a recess is formed in a semiconductor substrate and a channel region is formed along a curvature of the recess instead of a horizontal channel region in the planar gate transistor. Furthermore, a transistor with a buried gate which is formed to be entirely buried within a recess has been studied.

On the other hand, when a semiconductor device having the buried gate is manufactured, a bit line in a cell area and a gate in a peripheral circuit area are simultaneously patterned and thus problems due to performing the same process on the cell area and the peripheral circuit area are caused.

In brief, after the bit line in the cell area and the gate in the peripheral circuit area are simultaneously patterned, an interlayer insulating layer is deposited on the cell area and the peripheral circuit area to define a storage node contact. At this time, boro phosphorous silicate glass (BPSG) is used as the interlayer insulating layer to be precisely buried between the bit lines of the cell area. Here, a spacer which is formed on the gate of the peripheral circuit area is thickly formed to prevent boron of BPSG from penetrating into the semiconductor substrate.

However, the spacer is also thickly formed on a top and sidewall of the bit line in the cell area in addition to in the peripheral circuit area so that a contact area between an active region and a storage node contact in the cell area to be formed in the following is reduced and thus resistance is increased. Further, when the BPSG is formed as the interlayer insulating layer, an annealing process is normally needed and thus operation current of the gate in the peripheral circuit area is reduced and leakage current is increased. When the storage node in the cell area is formed, a hard mask layer as an etch stop layer is thickly formed. This process is similarly adapted in forming a gate so that a height of the gate is increased and it is impossible to easily control a tilt angle in an implantation process.

SUMMARY

The inventive concept is to provide a semiconductor device capable of preventing device degradation due to the same effect on a cell area and peripheral circuit area and a method of manufacturing the same.

According to one aspect of an exemplary embodiment, a semiconductor device includes a semiconductor substrate including a cell region and a peripheral circuit region, a first trench for device isolation formed in the cell region of the semiconductor substrate and a second trench for device isolation formed within the semiconductor substrate of the peripheral circuit region, the second trench being deeper than the first trench, a device isolation layer filling the first and second trenches and being substantially flushed to an upper surface of the semiconductor substrate in the cell region, a buried gate buried in the semiconductor substrate of the cell region and a peripheral circuit gate provided in the peripheral circuit region and being in contact with the semiconductor substrate, the peripheral circuit gate being formed within the device isolation layer and having an upper surface that is at substantially the same surface level as that of the buried gate.

The first and second trenches may be formed so that a bottom of the second trench in the peripheral circuit region extends deeper than that of the first trench formed in the cell region by a height of the buried gate.

The thickness of the buried gate may be 1400 Å to 1500 Å.

The buried gate buried within the cell region may include a gate electrode provided at a lower portion of a trench for the buried gate formed within the semiconductor substrate and an insulating layer formed over the gate electrode and within the trench for the buried gate.

The peripheral circuit gate may include a polysilicon layer being in contact with the semiconductor substrate of the peripheral circuit region, a gate electrode layer disposed on the polysilicon layer and a hard mask layer disposed on the gate electrode layer.

The semiconductor device may further include a bit line which is in contact with the semiconductor substrate of the cell region and the gate electrode in the peripheral circuit region.

The semiconductor device may further include a bit line which is in contact with the semiconductor substrate in the cell region and the peripheral circuit region.

The bit line in the cell region has an upper surface that is at substantially the same surface level as that of the bit line in the peripheral circuit region.

According to another aspect of an exemplary embodiment, a method of manufacturing a semiconductor device includes providing a semiconductor substrate including a cell region and a peripheral circuit region, forming a first trench for device isolation within the semiconductor substrate of the cell region and forming a second trench for device isolation within the semiconductor substrate of the peripheral circuit region, the second trench extending deeper than the first trench, forming a device isolation layer buried within the first and second trenches for device isolation, the device isolation layer having an upper surface that has substantially the same surface level as that of the semiconductor substrate of the cell area, forming a buried gate within the semiconductor substrate of the cell region, forming a peripheral circuit gate which is in contact with the semiconductor substrate of the peripheral circuit region, the peripheral circuit gate being provided within the device isolation layer of the peripheral circuit region and having an upper surface that is substantially at the same surface level as that of the buried gate.

The forming the second trench for device isolation of the peripheral area may include etching the semiconductor substrate so that the second trench is deeper than the first trench by a height of the buried gate formed in an active region of the cell region.

The forming the buried gate may include forming a trench for the buried gate in an active region defined by the device isolation layer of the cell region and the device isolation layer of the cell region, forming a gate electrode provided within a lower portion of the trench for the buried gate and forming an insulating layer over the gate electrode within the lower portion of the trench for the buried gate.

The forming the trench for the buried gate may include etching the active region of the cell region and the device isolation layer of the cell region by a thickness of 1400 Å to 1500 Å.

The forming the peripheral circuit gate may include forming a hole by etching the device isolation layer to expose the semiconductor substrate of the peripheral circuit region, forming a polysilicon layer within a lower portion of the hole to be in contact with the semiconductor substrate, forming a gate electrode layer on the polysilicon layer within the hole and forming a hard mask layer on the gate electrode layer within the hole.

The method may further, after forming the peripheral circuit gate, forming a bit line which is in contact with the semiconductor substrate of the cell region and the gate electrode in the peripheral circuit region.

The forming the bit line may include forming an interlayer insulating layer on the semiconductor substrate, forming an interlayer insulating layer on the semiconductor substrate, etching the interlayer insulating layer to expose the semiconductor substrate of the cell region and etching the interlayer insulating layer and the hard mask layer to expose the gate electrode layer of the peripheral circuit region, thereby forming a bit line contact hole, forming a bit line electrode layer to be buried within the bit line contact hole and forming a hard mask layer on the bit line electrode layer.

The method may further, after forming the peripheral circuit gate, comprising forming a bit line which is in contact with the semiconductor substrate of the cell area and peripheral circuit area.

The forming the bit line may include forming an interlayer insulating layer, etching the interlayer insulating layer to expose the semiconductor substrate of the cell region and etching the interlayer insulating layer and the device isolation layer to expose the semiconductor substrate of the peripheral circuit region, thereby forming a bit line contact hole, forming a bit line electrode layer to be buried within the bit line contact hole and forming a hard mask layer on the bit line electrode layer.

These and other features, aspects, and embodiments are described below in the section entitled "DESCRIPTION OF EXEMPLARY EMBODIMENT"

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
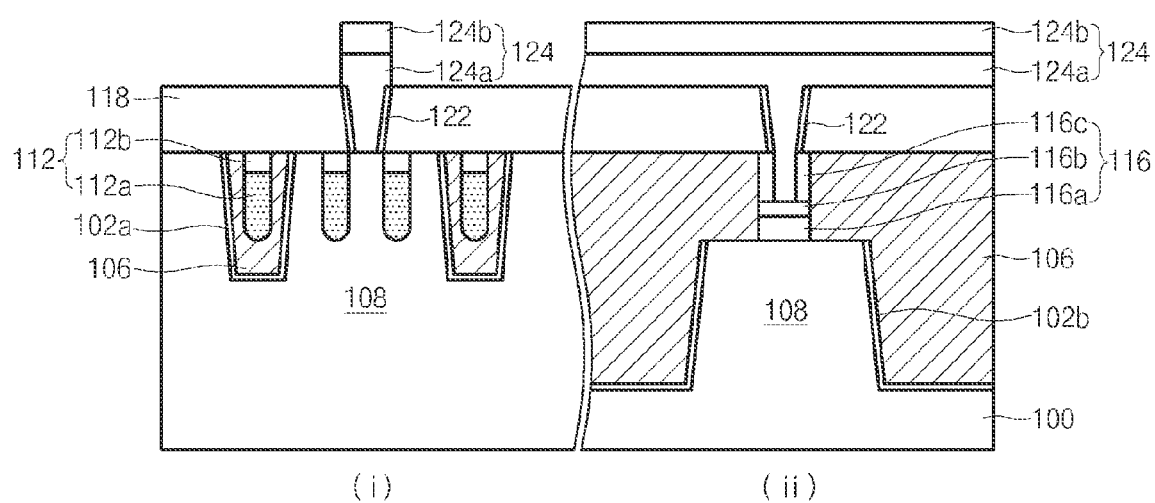
FIG. 1 is a cross-sectional view illustrating a semiconductor device according to an embodiment of the present invention.

Embodiments of the present invention are described herein with reference to cross-sectional illustrations that are schematic illustrations of the embodiments (and intermediate structures). As such, variations in the shapes of the illustrations, for example, of manufacturing techniques and/or tolerances, are to be expected. Thus, these embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intermediate layers may also be present.

Hereinafter, a semiconductor device and a method of manufacturing the same according to an embodiment of the present invention will be described in detail with reference to accompanying drawings.

Referring to FIG. 1, the semiconductor device according to an embodiment of the present invention includes trenches 102a and 102b for device isolation formed in a cell area (also referred as "cell region") i and a peripheral circuit area ii (also referred to as "peripheral circuit region" or "peripheral region"). The trench 102b is formed to be deeper than the trench 102a. A device isolation layer 106 is buried within the trenches 102a and 102b and has the same surface level as a semiconductor substrate 100 of the cell area i. A buried gate 112 is formed within the semiconductor substrate 100 of the cell area i. The buried gate 112 may comprise a stacking structure including the gate electrode 112a and the insulating layer 112b.

A peripheral circuit gate 116 is in contact with the semiconductor substrate 100 of the peripheral circuit area ii and is buried within the device isolation layer 106 of the peripheral circuit area ii. The peripheral circuit gate 116 has the same surface level as the buried gate 112, i.e., the upper surface of the peripheral circuit gate is at the substantially the same level as that of the buried gate 112. The peripheral circuit gate 116 may comprise a stacking structure including a polysilicon layer 116a, a gate electrode 116b and a hard mask layer 116c. An interlayer insulating layer 118 is formed on the semiconductor substrate 100 of the cell area i and the device isolation layer 106 of the peripheral circuit area ii.

Here, the trenches 102a and 102b may be formed so that a bottom of the trench 102b for device isolation disposed in the peripheral circuit area ii is deeper than that of the trench 102a for device isolation disposed in the cell area i by a depth of the buried gate 112 from the surface of the active region 108 of the cell area i. In more detail, the bottom of the trench 102b for device isolation disposed in the peripheral circuit area ii is 1400 Å to 1500 Å deeper than that of the trench 102a for device isolation disposed in the cell area i.

The semiconductor device may further include a bit line 124 including a bit line metal 124a which is in contact with the semiconductor substrate 100 of the cell area i and a gate electrode 116b of the peripheral circuit area ii and a hard mask layer 124b formed on the bit line metal 124a. Here, the bit line 124 of the cell area i has the same surface level as the bit line 124 of the peripheral circuit area ii.

As above described, according to an embodiment of the present invention, since the trenches for device isolation are formed so that the trench for device isolation in the peripheral circuit area ii is deeper than that of the trench for device isolation in the area i, the gate in the cell area i has the surface level as the gate in the peripheral circuit area ii and the bit line in the cell area i has the surface level as the bit line in the peripheral circuit area ii, thereby preventing degrading characteristics of the semiconductor device.

Hereinafter, a method of manufacturing a semiconductor device having the above-described structure according to an embodiment of the present invention will be described.

Figure 2A:
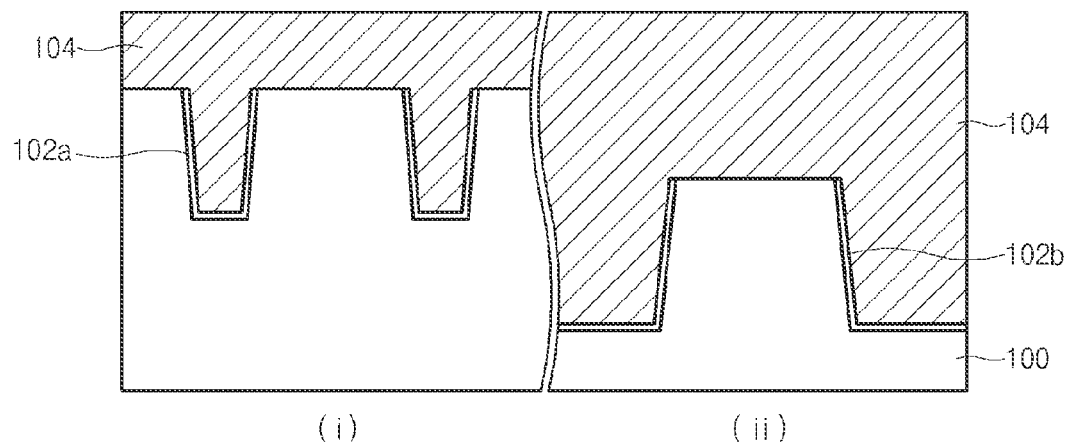
FIGS. 2A to 2D are cross-sectional views illustrating a method of manufacturing a semiconductor device according to an embodiment of the present invention.

Referring to FIG. 2A, trenches 102a and 102b are formed by etching a semiconductor substrate 100 including a cell area i and a peripheral circuit area ii. At this time, the trench 102a is formed in the cell area i and may be formed to receive a device isolation layer. The trench 102b is formed in the peripheral circuit area ii and may be also formed to receive a device isolation layer. The depth of the trench 102b may be deeper than that of the trench 102a.

In more detail, the trench 102b may be formed by etching the semiconductor substrate 100 of the peripheral circuit area ii deeper than the trench 102a of the cell area i by a depth of a buried gate trench (not shown) which is formed in a subsequent process. The semiconductor substrate may be etched to a thickness of 1400 Å to 1500 Å. Subsequently, an insulating layer 104 for device isolation is formed on the semiconductor substrate 100 including the trenches 102a and 102b.

Figure 2B:
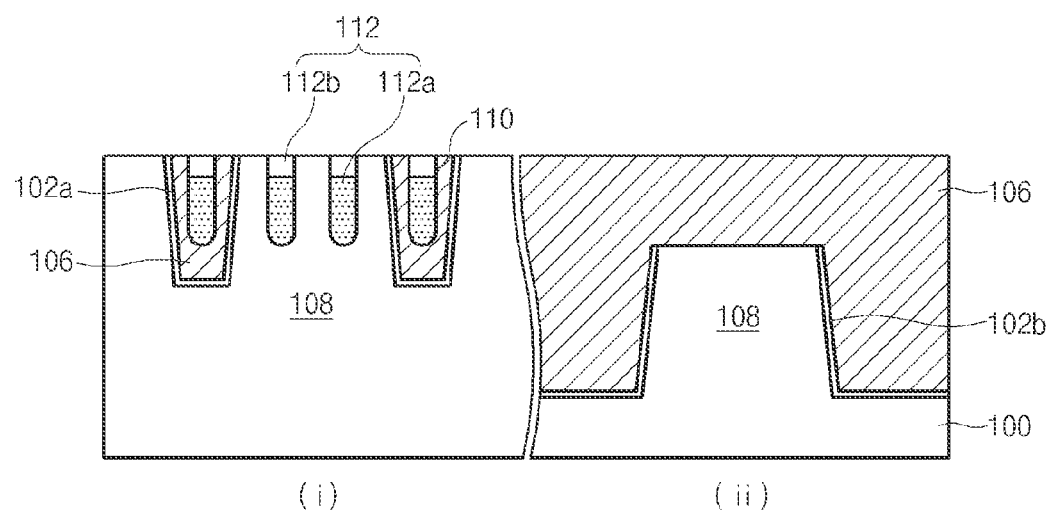

Referring to FIG. 2B, the planarization process for the insulating layer 104 for device isolation is performed to expose a surface of the semiconductor substrate 100 of the cell area I, thereby forming a device isolation layer 106. At this time, a surface of the semiconductor substrate 100 of the peripheral circuit area ii is not exposed. A device isolation layer of the peripheral circuit area ii has a greater thickness than a device isolation layer of the cell area i. An active region 108 is defined by the process of forming the device isolation layer 106.

Subsequently, a trench 110 for a buried gate is formed by etching the semiconductor substrate 100 and the device isolation layer 106 of the cell area i. A gate conductive layer is formed to be buried within the trench 110 and then an etching back process for the gate conductive layer is performed to form a gate electrode 112a at a lower portion of the trench 110. Subsequently, an insulating layer 112b is formed on the gate electrode 112a to be buried within the trench 110. For convenience, a stacking structure including the gate electrode 112a and the insulating layer 112b will be referred to as a buried gate 112.

Figure 2C:
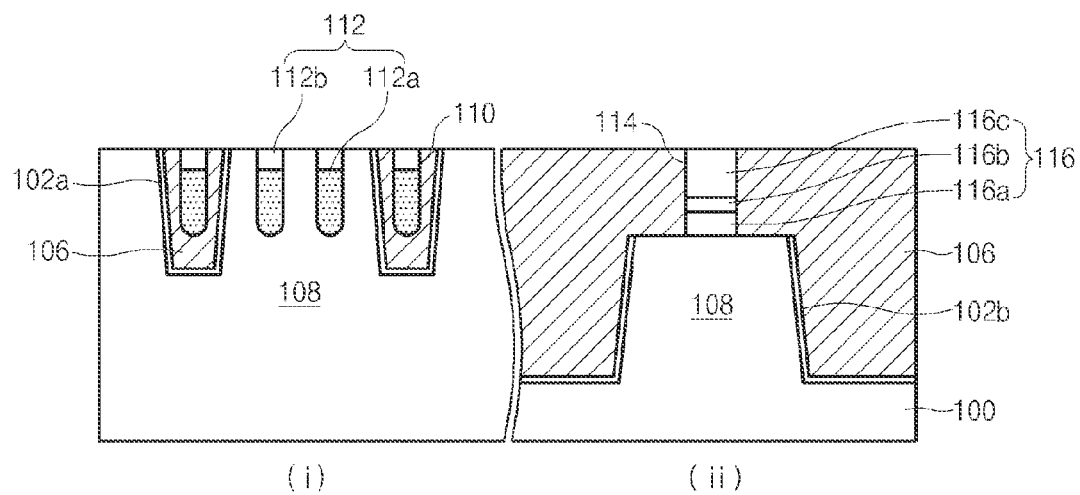

Referring to FIG. 2C, the device isolation layer 106 is etched to expose the semiconductor substrate 100 of the peripheral circuit area ii, thereby forming a hole 114 defining a gate of the peripheral circuit area ii. Subsequently, a polysilicon layer 116a, a gate electrode 116b and a hard mask layer 116c are formed on the semiconductor substrate 100 of the peripheral circuit area ii to define a peripheral circuit gate 116 buried within the hole 114.

Figure 2D:
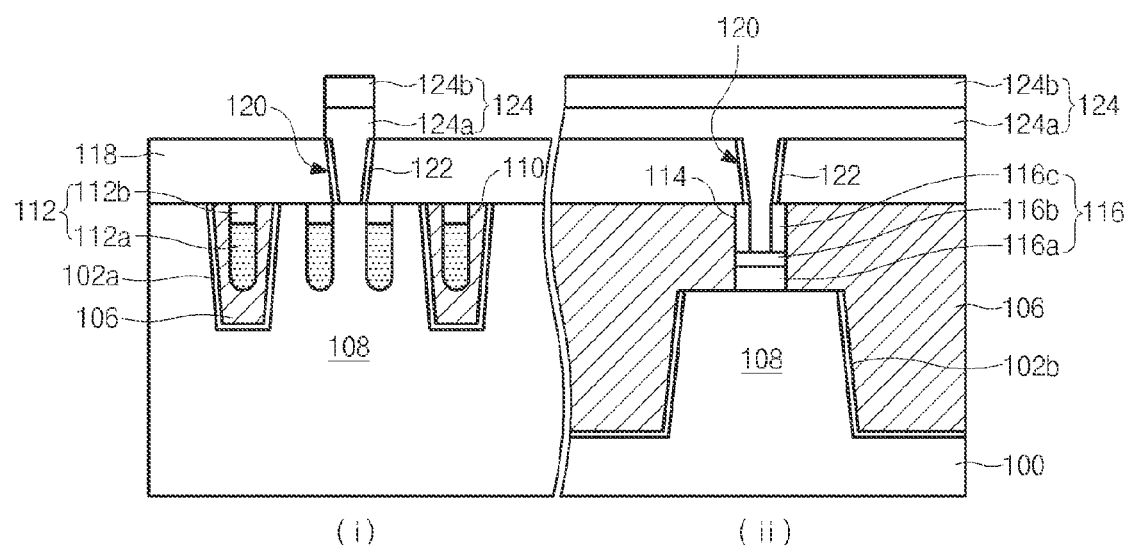

Referring to FIG. 2D, an interlayer insulating layer 118 is formed on the semiconductor substrate 100 of the cell area i and the device isolation layer 106 of the peripheral circuit area ii and a contact hole 120 is formed to expose the semiconductor substrate 100 of the cell area i and the gate electrode 116b of the peripheral circuit area ii. Here, the contact hole 120 may be a bit line contact hole. A spacer 122 is formed on a sidewall of the contact hole 120 and a bit line electrode 124a and a hard mask layer 124b are formed to be buried within the contact hole 120, thereby obtaining a bit line 124.

The present invention is not limited to the above-described embodiment and can be implemented by other embodiments. A semiconductor device according to another embodiment of the inventive concept changes a position in which a bit line of the peripheral circuit area ii is formed and will be described in detail with reference to FIG. 3.

Figure 3:
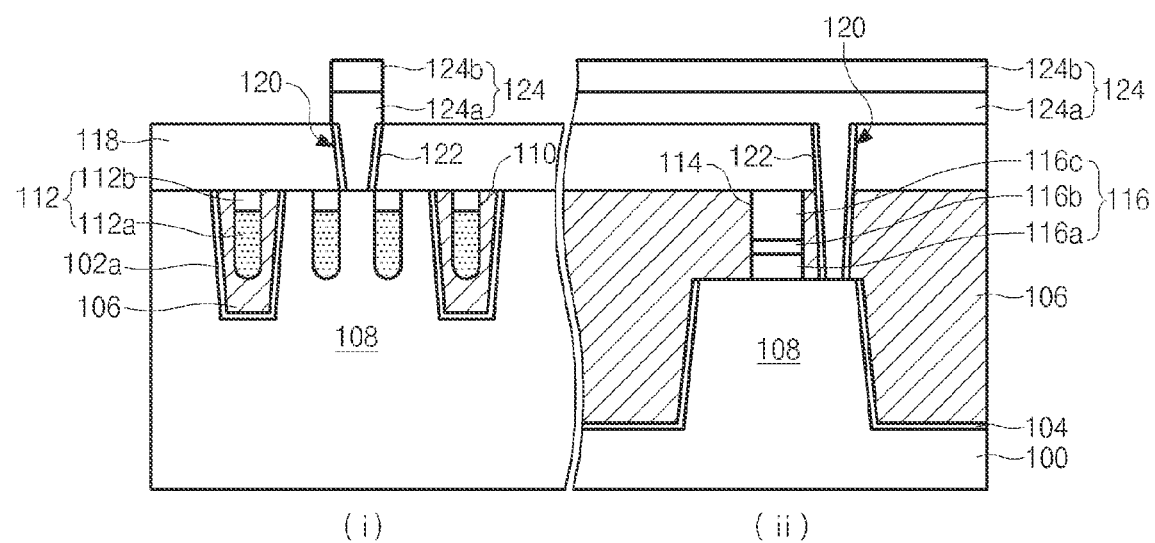
FIG. 3 is a cross-sectional view illustrating a semiconductor device according to another embodiment of the present invention.

A semiconductor device of FIG. 3 has the same configuration as the configuration of the semiconductor device according to an embodiment of FIG. 1 other than a configuration of the bit line and thus description of an overlapping portion with FIG. 1 is referred to as FIG. 1.

Referring to FIG. 3, the semiconductor device according to another embodiment of the present invention further includes a bit line 124 including a bit line metal 124a which is in contact with a semiconductor substrate 100 of the cell area i and a peripheral circuit area ii and a hard mask layer 124b formed on the bit line metal 124a. Here, the bit line of a cell area i has the same surface level as the bit line of the peripheral circuit area ii.

As described above, according to the embodiments of the present invention, the trench for device isolation layer of the peripheral circuit area is formed deeper than the trench for device isolation layer of the cell area in the structure including the buried gate so that the gate of the peripheral circuit area is formed in the same layer as the buried gate and the bit line is also formed in the same layer. Thereby, the number of masks is reduced and the process is simplified so that cost can be reduced and characteristics of the semiconductor device can be improved.

As described above, according to an embodiment of the present invention, the first gate electrode is formed to be buried within the semiconductor substrate and the second gate electrode is formed to be buried within the silicon growth layer grown using the semiconductor substrate as a seed so that two gate electrodes are formed in the same area. Thereby, the memory capacity is increased even in the narrow active region and it can be adapted to a semiconductor device with high integration.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:
1. A semiconductor device, comprising:
a semiconductor substrate including a cell region and a peripheral circuit region;
a first trench for device isolation formed in the cell region of the semiconductor substrate and a second trench for device isolation formed within the semiconductor substrate of the peripheral circuit region, the second trench being deeper than the first trench;

a device isolation layer filling the first and second trenches and being substantially flush with an upper surface of the semiconductor substrate in the cell region;

a buried gate buried in the semiconductor substrate of the cell region;

a peripheral circuit gate including a gate electrode, the peripheral circuit gate being provided in the peripheral circuit region and being in contact with the semiconductor substrate, and the peripheral circuit gate being formed within the device isolation layer and having an upper surface that is at substantially the same surface level as that of the buried gate; and a bit line which is in contact with the semiconductor substrate of the cell region and the gate electrode in the peripheral circuit region.

2. The semiconductor device of claim 1, wherein the first and second trenches are formed so that a bottom of the second trench in the peripheral circuit region extends deeper than that of the first trench formed in the cell region by a height of the buried gate.

3. The semiconductor device of claim 1, wherein the thickness of the buried gate is 1400 Å to 1500 Å.

4. The semiconductor device of claim 1, wherein the buried gate buried within the cell region includes:

a gate electrode provided at a lower portion of a trench for the buried gate formed within the semiconductor substrate; and an insulating layer formed over the gate electrode and within the trench for the buried gate.

5. The semiconductor device of claim 1, wherein the peripheral circuit gate further includes:

a polysilicon layer being in contact with the semiconductor substrate of the peripheral circuit region; and a hard mask layer disposed on the gate electrode layer, wherein the gate electrode is disposed on the polysilicon layer.

6. The semiconductor device of claim 1, wherein the bit line in the cell region has an upper surface that is at substantially the same surface level as that of the bit line in the peripheral circuit region.

7. A semiconductor device, comprising:

a semiconductor substrate including a cell region and a peripheral circuit region;

a first trench for device isolation formed in the cell region of the semiconductor substrate and a second trench for device isolation formed within the semiconductor substrate of the peripheral circuit region, the second trench being deeper than the first trench;

a device isolation layer filling the first and second trenches and being substantially flush with an upper surface of the semiconductor substrate in the cell region;

a buried gate buried in the semiconductor substrate of the cell region;

a peripheral circuit gate including a gate electrode layer, the peripheral circuit gate being provided in the peripheral circuit region and being in contact with the semiconductor substrate, and the peripheral circuit gate being formed within the device isolation layer and having an upper surface that is at substantially the same surface level as that of the buried gate; and a bit line which is in contact with the semiconductor substrate in the cell region and the peripheral circuit region.

8. The semiconductor device of claim 7, wherein the bit line in the cell region has an upper surface that is at substantially the same surface level as that of the bit line in the peripheral circuit region.

9. The semiconductor device of claim 7, wherein the first and second trenches are formed so that a bottom of the second trench in the peripheral circuit region extends deeper than that of the first trench formed in the cell region by a height of the buried gate.

10. The semiconductor device of claim 7, wherein the bit line in the cell region has an upper surface that is at substantially the same surface level as that of the bit line in the peripheral circuit region.

* * * * *